(12) United States Patent
Kim et al.

(10) Patent No.: US 12,537,539 B2
(45) Date of Patent: Jan. 27, 2026

(54) SUCCESSIVE APPROXIMATION ANALOG-TO-DIGITAL CONVERSION DEVICE SKIPPING COMPARISON RESULTS AND ITS OPERATING METHOD

(71) Applicant: KOREA UNIVERSITY RESEARCH AND BUSINESS FOUNDATION, Seoul (KR)

(72) Inventors: Chulwoo Kim, Seoul (KR); Sooho Park, Seoul (KR); Yohan Choi, Seoul (KR); Chang Joo Kim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 181 days.

(21) Appl. No.: 18/471,437

(22) Filed: Sep. 21, 2023

(65) Prior Publication Data
US 2024/0340020 A1 Oct. 10, 2024

(30) Foreign Application Priority Data
Apr. 6, 2023 (KR) .................. 10-2023-0045482

(51) Int. Cl.
*H03M 1/12* (2006.01)
*H03M 1/46* (2006.01)

(52) U.S. Cl.
CPC ......... *H03M 1/462* (2013.01); *H03M 1/1245* (2013.01)

(58) Field of Classification Search
CPC .... H03M 1/462; H03M 1/1245; H03M 1/361; H03M 1/145; H03M 1/468; H03M 1/403
USPC ....................................................... 341/155
See application file for complete search history.

(56) References Cited

U.S. PATENT DOCUMENTS

| | | | |
|---|---|---|---|
| 9,973,202 B2 * | 5/2018 | Yoshioka | H03M 1/0854 |
| 10,673,455 B2 * | 6/2020 | Kulkarni | H03M 1/468 |
| 10,790,842 B1 * | 9/2020 | Paussa | H03M 1/069 |
| 10,886,933 B1 * | 1/2021 | Ghosh | H03M 1/164 |
| 2009/0195423 A1 * | 8/2009 | Li | H03M 3/474 |
| | | | 341/172 |
| 2017/0045578 A1 * | 2/2017 | Okuda | H03M 1/1038 |

(Continued)

FOREIGN PATENT DOCUMENTS

| | | |
|---|---|---|
| KR | 10-2274467 B1 | 7/2021 |
| KR | 10-2290002 B1 | 8/2021 |
| KR | 10-2022-0106648 A | 7/2022 |

OTHER PUBLICATIONS

Korean Office Action Issued on May 23, 2024, in Counterpart Korean Patent Application No. 10-2023-0045482 (4 Pages in Korean).

*Primary Examiner* — Jean B Jeanglaude
(74) *Attorney, Agent, or Firm* — NSIP Law (57) ABSTRACT

The analog-to-digital conversion device includes a signal generating unit that generates a plurality of comparison voltages based on an analog input voltage and generates a plurality of comparison results of the plurality of comparison voltages based on a sampling period, a calculation unit that skips a comparison result generated by a comparison voltage having a smallest difference between the analog input voltages among the plurality of comparison voltages from the plurality of comparison results and generates an end of comparison based on a remaining plurality of comparison results, and a SAR logic unit that generates a digital signal corresponding to the end of comparison and stores information for each bit of the digital signal.

10 Claims, 8 Drawing Sheets

(56) References Cited

U.S. PATENT DOCUMENTS

2019/0280706 A1\* 9/2019 Bodnar ................. H03M 1/164
2019/0296760 A1\* 9/2019 Kim .................... H03M 1/1245
2021/0119638 A1 4/2021 Ghosh et al.

\* cited by examiner

SUCCESSIVE APPROXIMATION ANALOG-TO-DIGITAL CONVERSION DEVICE SKIPPING COMPARISON RESULTS AND ITS OPERATING METHOD

CROSS-REFERENCE TO RELATED APPLICATIONS

This application claims priority under 35 U.S.C. § 119 to Korean Patent Application No. 10-2023-0045482 filed on Apr. 6, 2023, in the Korean Intellectual Property Office, the disclosures of which are incorporated by reference herein in their entireties.

BACKGROUND

Embodiments of the present disclosure described herein relate to a successive approximation analog-to-digital conversion device skipping comparison results and an operation method thereof.

A conventional analog-to-digital conversion devices repeatedly compare an analog signal with a bit-by-bit comparison voltage of a digital signal. As the comparison operations are repeated, the time required to compare the analog signal with the bit-by-bit comparison voltage of the digital signal may increase. In addition, when the difference between the comparison voltage and the analog signal is relatively small, an error may occur in a digital signal output from the analog-to-digital conversion device.

SUMMARY

Embodiments of the present disclosure provide a successive approximation analog-to-digital conversion device skipping comparison results and an operation method thereof.

According to an embodiment of the present disclosure, an analog-to-digital conversion device includes a signal generating unit that generates a plurality of comparison voltages based on an analog input voltage and generates a plurality of comparison results of the plurality of comparison voltages based on a sampling period, a calculation unit that skips a comparison result generated by a comparison voltage having a smallest difference between the analog input voltages among the plurality of comparison voltages from the plurality of comparison results and generates an end of comparison based on a remaining plurality of comparison results, and a SAR logic unit that generates a digital signal corresponding to the end of comparison and stores information for each bit of the digital signal.

According to an embodiment, the signal generating unit may include a sampling/hold circuit that samples the analog input voltage to a sampling voltage based on the sampling period, a converter circuit that converts the sampling voltage into the plurality of comparison voltages, and a comparison unit that inverts a phase of the plurality of comparison voltages to generate a plurality of enlarged comparison voltages and outputs the plurality of comparison results based on the plurality of enlarged comparison voltages.

According to an embodiment, the converter circuit may perform a capacitor switching operation for adjusting the sampling period of the sampling voltage.

According to an embodiment, the analog-to-digital conversion device may detect a predetermined range in the sampling period.

According to an embodiment, the end of comparison may be output as a logic high level or a logic low level.

According to an embodiment of the present disclosure, a method of operating an analog-to-digital conversion device includes generating a plurality of comparison voltages based on an analog input voltage, and generating a plurality of comparison results of the plurality of comparison voltages based on a sampling period, skipping a comparison result generated by a comparison voltage having a smallest difference between the analog input voltages among the plurality of comparison voltages from the plurality of comparison results, and generating an end of comparison based on a remaining plurality of comparison results, and generating a digital signal corresponding to the end of comparison and storing information for each bit of the digital signal.

According to an embodiment, the generating of the plurality of comparison results may include sampling the analog input voltage to a sampling voltage based on the sampling period, converting the sampling voltage into the plurality of comparison voltages, and inverting a phase of the plurality of comparison voltages to generate a plurality of enlarged comparison voltages and outputting the plurality of comparison results based on the plurality of enlarged comparison voltages.

According to an embodiment, the converting of the sampling voltage into the plurality of comparison voltages may include performing a capacitor switching operation for adjusting the sampling period of the sampling voltage.

According to an embodiment, the method of operating the analog-to-digital conversion device may include detecting a predetermined range in the sampling period.

According to an embodiment, the end of comparison may be output as a logic high level or a logic low level.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure may be described in detail and clearly to such an extent that an ordinary one in the art easily implements the present disclosure.

Figure 1:
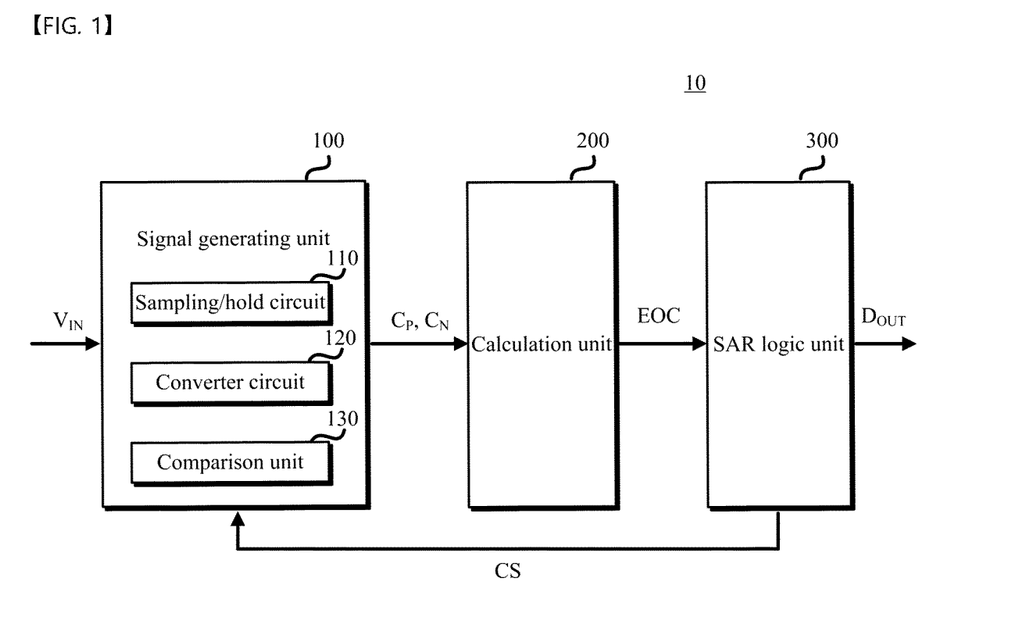
FIG. 1 is a block diagram of an analog-to-digital conversion device according to an embodiment of the present disclosure.

FIG. 1 is a block diagram of an analog-to-digital conversion device according to an embodiment of the present disclosure.

An analog-to-digital conversion device 10 according to an embodiment of the present disclosure may receive an analog input voltage, may perform a conversion operation on the analog input voltage to compare the input voltage with a plurality of comparison voltages. In addition, the analog-to-digital conversion device 10 may decrease the error of unit bit information of a digital signal Dour by skipping (e.g., omit, bypass, etc.) the comparison result generated by the comparison voltage having the smallest difference between analog input voltages among the plurality of comparison voltages, and may operate at high speed.

Referring to FIG. 1, in more detail, the analog-to-digital conversion device 10 according to an embodiment of the present disclosure includes a signal generating unit 100, a calculation unit 200, and a SAR logic unit 300.

The signal generating unit 100 may receive an analog signal and may perform a conversion operation on the analog signal. To this end, the signal generating unit 100 includes a sampling/hold circuit 110, a converter circuit 120, and a comparison unit 130.

The sampling/hold circuit 110 may sample the input voltage $V_{IN}$, which is an analog signal, as a sampling voltage based on the sampling signal. Here, the sampling voltage may include a sampling period between a minimum comparison voltage and a maximum comparison voltage. In addition, the sampling/hold circuit 110 may generate a voltage sampled from the input voltage $V_{IN}$ and may output the generated voltage to the converter circuit 120.

The converter circuit 120 may generate a comparison voltage to be generated among digital signals based on a control signal CS applied from the outside. The comparison voltage may have a voltage level obtained by adding or subtracting the voltage level of a reference voltage from the voltage level of the sampling voltage received from the sampling/hold circuit 110. In detail, the converter circuit 120 may perform a capacitor switching operation for adjusting the sampling period of the sampling voltage. For example, the converter circuit 120 may generate each comparison voltage through a capacitor switching operation in response to the control signal CS output from the SAR logic unit 300. In addition, the converter circuit 120 may provide a comparison voltage according to each bit to the comparison unit 130.

The comparison unit 130 may include a plurality of comparators corresponding to comparison voltages, and may generate comparison results $C_P$ and $C_N$ by comparing the comparison voltage of the digital signal with the input voltage $V_{IN}$. When the comparison unit 130 completes the comparison operation, the comparison results $C_P$ and $C_N$ may have different values. For example, each of the comparison results $C_P$ and $C_N$ may be a logic high level or a logic low level.

The calculation unit 200 may perform a logical operation on the comparison results $C_P$ and $C_N$ and may output an end of comparison EOC. For example, when the comparison unit 130 completes the comparison operation and outputs comparison results $C_P$ and $C_N$ of different logic levels, the calculation unit 200 may output the end of comparison EOC through a logic gate. The logic gate of the calculation unit 200 may be a NAND gate or an XOR gate, but is not limited thereto.

In addition, the calculation unit 200 may skip the comparison results $C_P$ and $C_N$ depending on the difference between the comparison voltage and the input voltage $V_{IN}$.

For example, the calculation unit 200 may skip one comparison result generated by a comparison voltage having the smallest difference between the comparison voltage and the input voltage $V_{IN}$. Accordingly, the calculation unit 200 may provide the end of comparison EOC generated based on a remaining plurality of comparison results to the SAR logic unit 300. However, the calculation unit 200 will not be limited to the difference between the comparison voltage and the input voltage $V_{IN}$. For example, the calculation unit 200 may skip the comparison results $C_P$ and $C_N$ based on a preset time.

The SAR logic unit 300 may supply the control signal CS to the converter circuit 120, and the converter circuit 120 may generate a comparison voltage in response to the control signal CS. The control signal CS may refer to a signal that controls switching elements of the converter circuit 120 to set the comparison voltage. The SAR logic unit 300 may receive the end of comparison of the digital signal DOUT from the calculation unit 200 and may store information for each bit corresponding to the end of comparison.

As described above, the analog-to-digital conversion device 10 according to the embodiment of the present disclosure may determine whether comparator operation is completed through the end of comparison EOC of the calculation unit 200, and may operate quickly by skipping the comparison results $C_P$ and $C_N$ of comparators in which decision time of some comparators is delayed.

Figure 2:
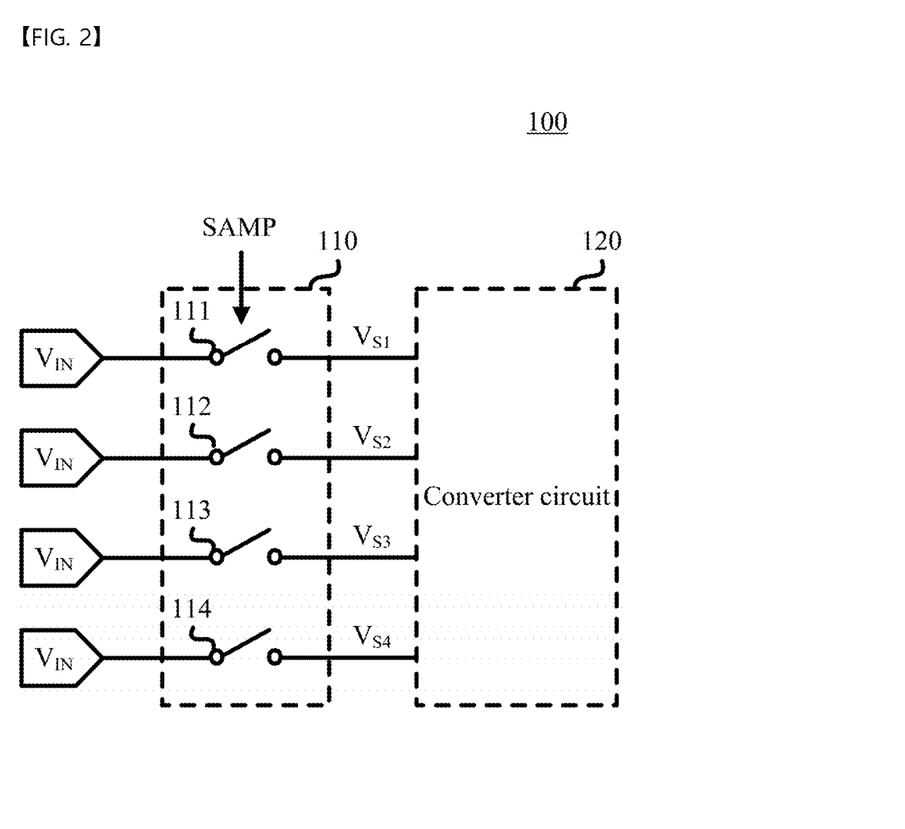
FIG. 2 is a diagram illustrating a sampling/hold circuit of FIG. 1 in detail.

FIG. 2 is a diagram illustrating a sampling/hold circuit of FIG. 1 in detail.

Referring to FIG. 2, the sampling/hold circuit 110 may include first to fourth switches 111, 112, 113, and 114. The first to fourth switches 111, 112, 113, and 114 may connect or disconnect between an input terminal receiving the analog input voltage $V_{IN}$ and the converter circuit 120 in response to a preset sampling signal SAMP. In detail, the sampling/hold circuit 110 may sample the analog input voltage $V_{IN}$ to sampling voltages $V_{S1}$, $V_{S2}$, $V_{S3}$, and $V_{S4}$ based on the sampling signal SAMP. In this case, the sampling voltages $V_{S1}$, $V_{S2}$, $V_{S3}$, and $V_{S4}$ may include a sampling period 0 to $V_{ref}$ between a minimum comparison voltage 0V and a maximum comparison voltage $V_{ref}$.

Figure 3:
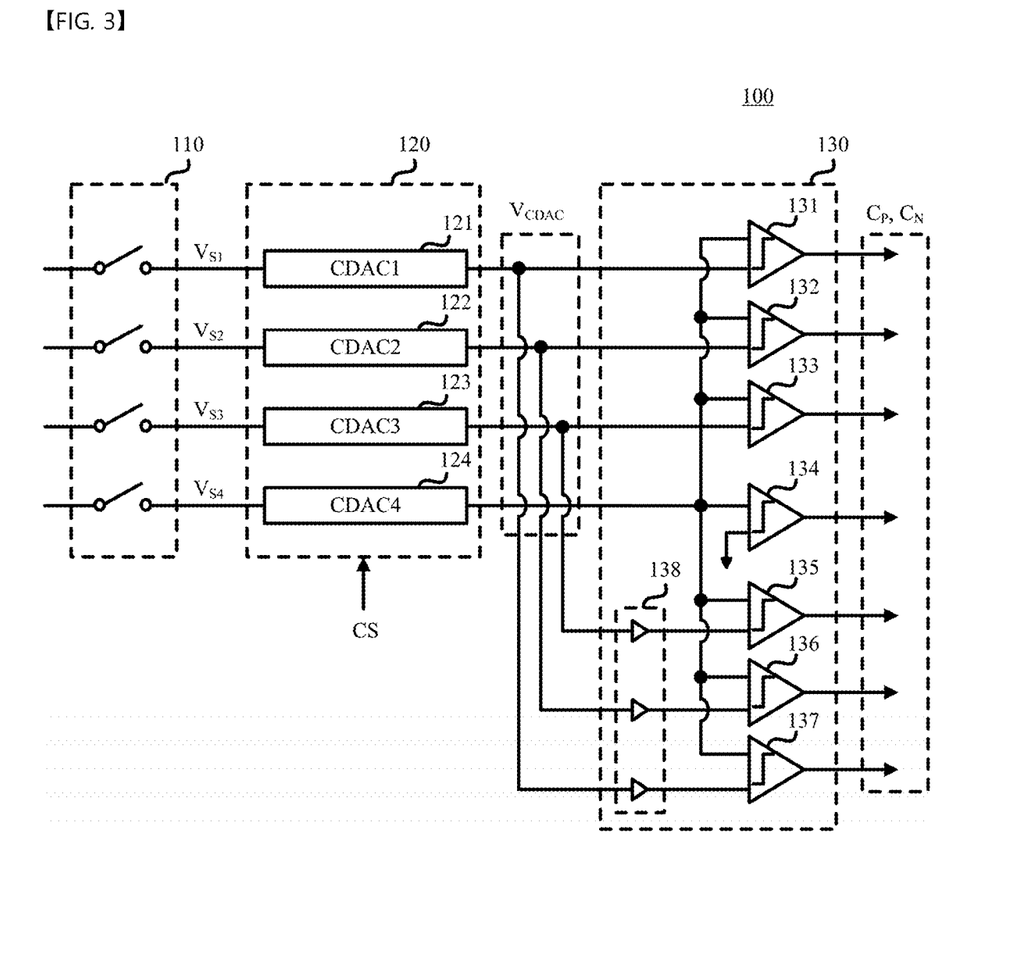
FIG. 3 is a diagram illustrating a signal generating unit of FIG. 1 in detail.

FIG. 3 is a diagram illustrating a signal generating unit of FIG. 1 in detail.

Referring to FIG. 3, the converter circuit 120 includes first to fourth capacitor converters 121, 122, 123, and 124, and may convert the sampling voltage $V_{S1}$, $V_{S2}$, $V_{S3}$, and $V_{S4}$ into a comparison voltage $V_{CDAC}$ based on the control signal CS of the SAR logic unit 300. For example, the first capacitor converter 121 may convert the sampling voltage $V_{S1}$ into the comparison voltage $V_{CDAC}$ based on the control signal CS, the second capacitor converter 122 may convert the sampling voltage $V_{S2}$ into the comparison voltage $V_{CDAC}$ based on the control signal CS, the third capacitor converter 123 may convert the sampling voltage $V_{S3}$ into the comparison voltage $V_{CDAC}$ based on the control signal CS, and the fourth capacitor converter 124 may convert the sampling voltage $V_{S4}$ into the comparison voltage $V_{CDAC}$ based on the control signal CS.

One side of each of the first to fourth capacitor converters 121, 122, 123, and 124 may be connected to any one of the first to fourth switches 111, 112, 113, and 114, and the other side of each of the first to fourth capacitor converters 121, 122, 123, and 124 may be connected to the comparison unit 130.

In addition, each of the first to fourth capacitor converters 121, 122, 123, and 124 may be a CDAC (Capacitive Digital to Analog Converter) performing a capacitor switching operation. In detail, each of the first to fourth capacitor converters 121, 122, 123, and 124 may adjust a sampling period of a pair of sampling voltages according to a unit bit operation mode through a capacitor switching operation. For example, the sampling period of the comparison voltage $V_{CDAC}$ may be $0V_{ref}$ to $3V_{ref}/4$.

Next, the comparison unit 130 may include first to seventh comparators 131, 132, 133, 134, 135, 136, and 137, and may output the comparison results $C_P$ and $C_N$ based on the difference between the input voltages $V_{IN}$ and the comparison voltage $V_{CDAC}$ converted by the converter circuit 120. One side of each of the first to seventh comparators 131, 132, 133, 134, 135, 136, and 137 may be connected to any one of the first to fourth capacitor converters 121, 122, 123, and 124, and the other side of each of the first to seventh comparators 131, 132, 133, 134, 135, 136, and 137 may be connected to the calculation unit 200. In addition, since the fifth to seventh comparators 135, 136, and 137 include an inverter 138, a phase of the comparison voltage $V_{CDAC}$ input to the fifth to seventh comparators 135, 136, and 137 may be inverted. In detail, the comparison unit 130 may enlarge the converted comparison voltage $V_{CDAC}$. For example, the first to seventh comparators 131, 132, 133, 134, 135, 136, and 137 may output the comparison results $C_P$ and $C_N$ using $-3V_{REF}/4$ to $3V_{REF}/4$ comparison voltages $V_{CDAC}$.

The first to third comparators 131, 132, and 133 according to an embodiment of the present disclosure are connected to one side of the first to third capacitor converters 121, 122, and 123, respectively, and may output the comparison results $C_P$ and $C_N$ based on the difference between the comparison voltage $V_{CDAC}$ and the input voltage $V_{IN}$. The fourth comparator 134 may have one side connected to the fourth capacitor converter 124 and may output the comparison results $C_P$ and $C_N$ based on the difference between the comparison voltage $V_{CDAC}$ and a ground voltage. The fifth to seventh comparators 135, 136, and 137 are connected to one side of the first to third capacitor converters 121, 122, and 123, respectively, and may output the comparison results $C_P$ and $C_N$ based on the difference between the input voltage $V_{IN}$ and the comparison voltage $V_{CDAC}$ in which phase is inverted through an inverter.

Figure 4:
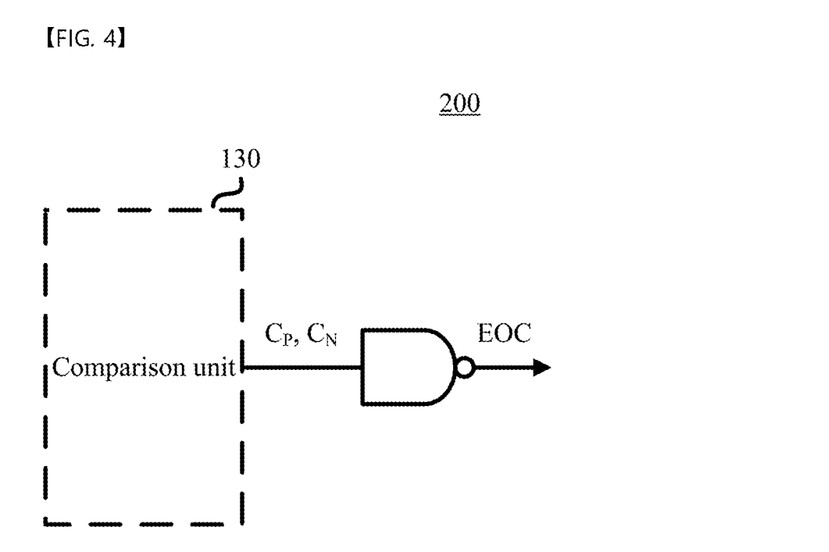
FIG. 4 is a diagram illustrating an example of a calculation unit according to an embodiment of FIG. 1.

FIG. 4 is a diagram illustrating an example of a calculation unit according to an embodiment of FIG. 1. For convenience of description, it will be assumed in FIG. 4 that a logic gate includes a NAND gate.

Referring to FIG. 4, the calculation unit 200 may include a NAND gate. The NAND gate may perform a NAND operation on the comparison results $C_P$ and $C_N$ and may output the end of comparison EOC. For example, when the comparison unit 130 completes the comparison operation and outputs the comparison results $C_P$ and $C_N$ of different logic levels, the output of the NAND gate may become a logic high level. In addition, when the comparison unit 130 completes the comparison operation and outputs the comparison results $C_P$ and $C_N$ of the same logic level, the output of the NAND gate may become a logic low level.

Figure 5:
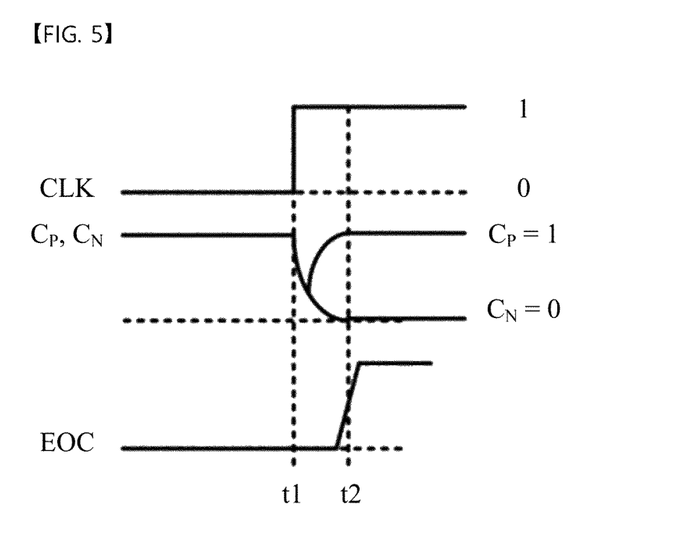
FIG. 5 is a timing diagram illustrating an operation of an analog-to-digital conversion device according to an embodiment of FIG. 1.

FIG. 5 is a timing diagram illustrating an operation of an analog-to-digital conversion device according to an embodiment of FIG. 1.

Referring to FIG. 5, in the analog-to-digital conversion device 10, the end of comparison EOC based on the comparison results $C_P$ and $C_N$ may be defined.

At a first time t1, when a clock signal CLK transitions to '1', the comparison unit 130 may output the comparison results $C_P$ and $C_N$.

At a second time t2, when the comparison unit 130 completes the comparison operation, the end of comparison EOC may transition to '1'.

As described above, the analog-to-digital conversion device 10 performs a comparison operation between the comparison voltage $V_{CDAC}$ and the input voltage $V_{IN}$ to output the comparison results $C_P$ and $C_N$, and the calculation unit 200 may output the end of comparison EOC corresponding to the comparison results $C_P$ and $C_N$. For example, when the difference between the comparison voltage $V_{CDAC}$ and the input voltage $V_{IN}$ is small, the comparison operation of the comparison unit 130 may be prolonged. In detail, the interval between the first time t1 and the second time t2 may be longer.

Figure 6A:
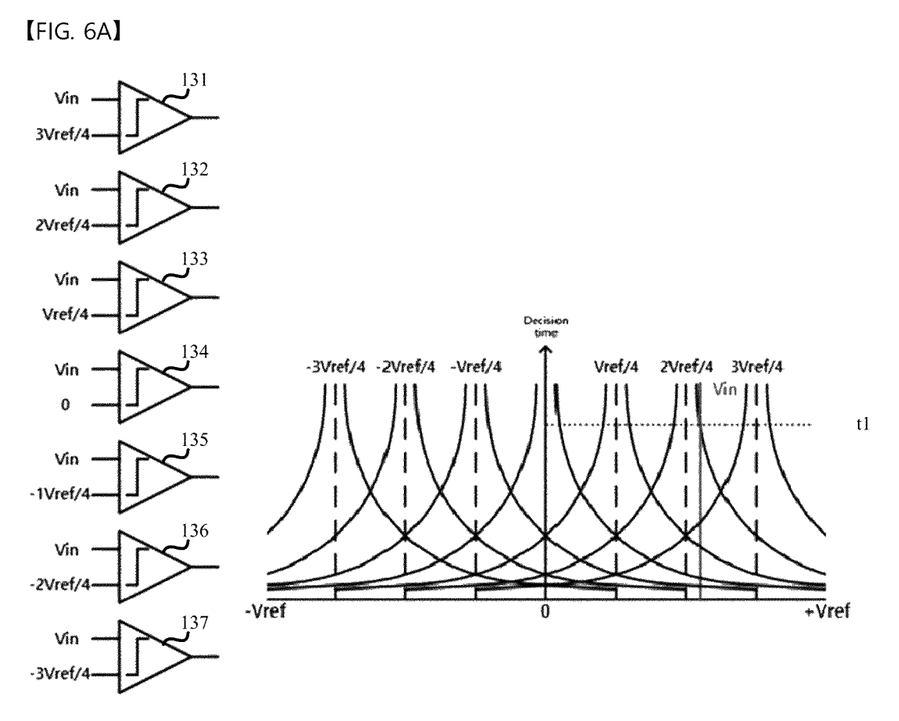
FIGS. 6A and 6B are comparison time graphs for describing an example of an analog-to-digital conversion device according to an embodiment of FIG. 1.
Figure 6B:
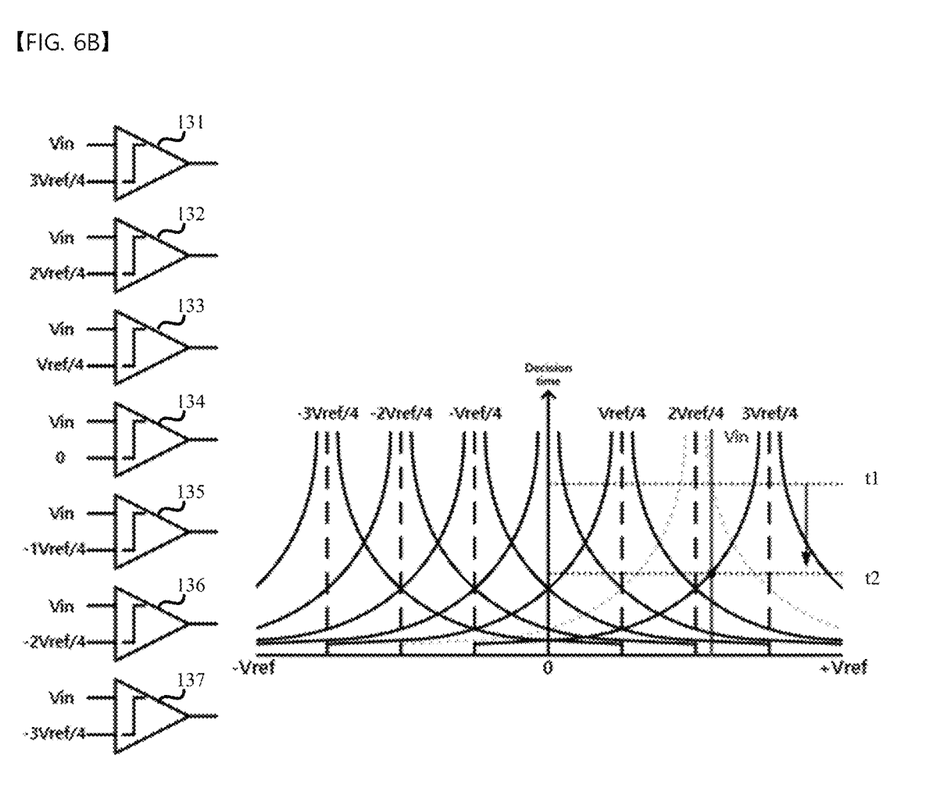

FIGS. 6A and 6B are comparison time graphs for describing an example of an analog-to-digital conversion device according to an embodiment of FIG. 1. In detail, in FIG. 6A, it will be assumed that a method of skipping one comparison results $C_P$ and $C_N$ is excluded based on the difference between the comparison voltage $V_{CDAC}$ and the input voltage $V_{IN}$ of FIG. 1. In addition, it will be assumed that the comparison unit 130 of FIGS. 6A and 6B outputs the comparison results $C_P$ and $C_N$ included in the sampling period $-V_{REF}$ to $V_{REF}$ between the minimum comparison voltage $-V_{ref}$ and the maximum comparison voltage $V_{ref}$.

Referring to FIG. 6A, when the comparison voltage of the second comparator 132 is $2V_{ref}/4$ and the input voltage $V_{IN}$ is similar to the comparison voltage of the second comparator 132, the decision time of the second comparator 132 may be the slowest compared to the decision times of the first and third to seventh comparators 131, 133, 134, 135, 136, and 137. For example, when the first to seventh comparators 131, 132, 133, 134, 135, 136, and 137 complete the comparison operation at the first time t1, the decision time of the second comparator 132 may be later than the decision times of the first and third comparators 131 and 133.

Referring to FIG. 6B, the analog-to-digital conversion device 10 according to an embodiment of the present disclosure may skip the comparison results $C_P$ and $C_N$ generated by the smallest comparison voltage $V_{CDAC}$ having the smallest difference between the comparison voltage $V_{CDAC}$ and the input voltage $V_{IN}$ through the calculation unit 200. For example, when the comparison voltage $V_{CDAC}$ is $2V_{ref}/4$ and the input voltage $V_{IN}$ is the input voltage $V_{IN}$ having the smallest difference from $2V_{ref}/4$, as the comparison results $C_P$ and $C_N$ of the second comparator 132 generated by the comparison voltage $V_{CDAC}$ of $2V_{ref}/4$ are skipped, the decision time of the analog-to-digital conversion device 10 may be decreased.

Figure 7A:
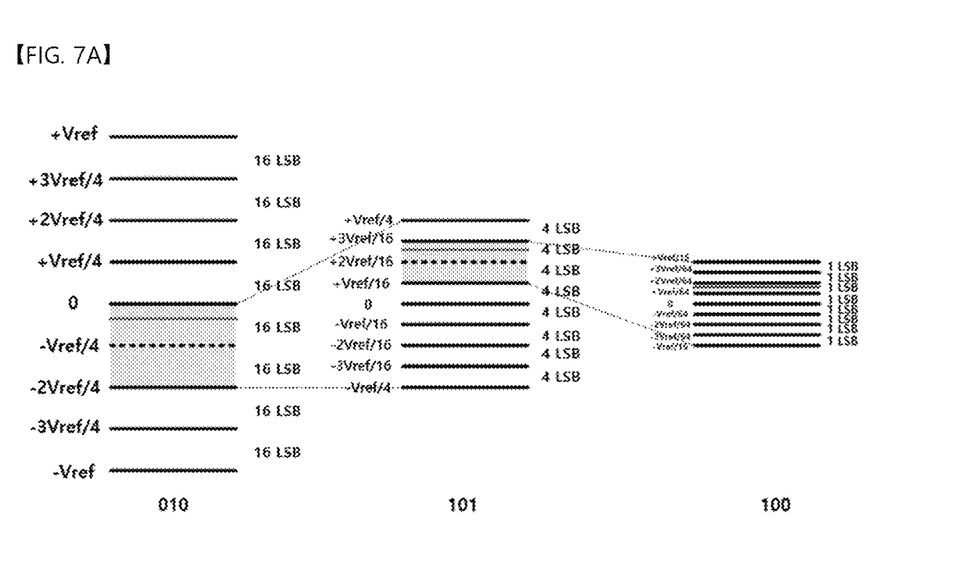
FIGS. 7A and 7B are operation graphs for describing an example of an analog-to-digital converter according to the embodiment of FIG. 1.
Figure 7B:
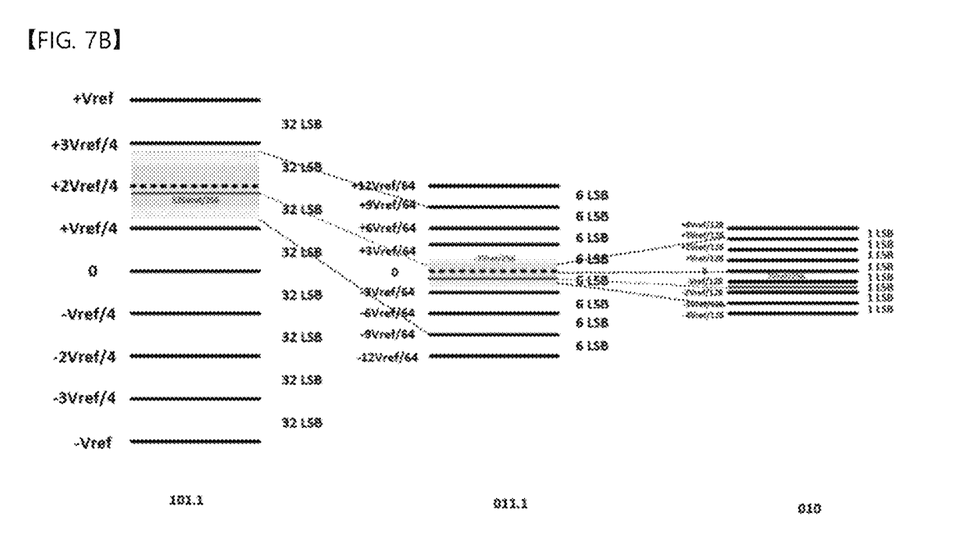

FIGS. 7A and 7B are operation graphs for describing an example of an analog-to-digital conversion device according to the embodiment of FIG. 1. For convenience of description, it will be assumed that the analog-to-digital conversion device 10 of FIG. 7A may decompose up to 7 bits when operating in 3 cycles, and the analog-to-digital conversion device 10 in FIG. 7B decomposes up to 9 bits when operating in 3 cycles. In addition, the analog-to-digital conversion device 10 of FIGS. 7A and 7B may detect a predetermined range in the sampling period $-V_{REF}$ to $V_{REF}$ by skipping some comparison results $C_P$ and $C_N$. For example, the analog-to-digital conversion device 10 may detect a ¼ or ⅛ range for each cycle, but the bit and detection range are an example and not limited thereto.

FIG. 7A is an example of detecting a ¼ range. Referring to FIG. 7A, when the input voltage $V_{IN}$ is similar to the comparison voltage $-V_{ref}/4$ of the fifth comparator 135, the analog-to-digital conversion device 10 may skip the comparison results $C_P$ and $C_N$ of the fifth comparator 135. For example, when the least significant bit (LSB) in 1 Cycle is 16 bits, since the analog-to-digital conversion device 10 may detect only ¼ of the range in the sampling period $-V_{REF}$ to $V_{REF}$ by skipping the comparison results $C_P$ and $C_N$ of some comparators, identification may be performed with only 2 bits. In addition, in the same way as above, when the least significant bit (LSB) in 2 cycles is 4 bits, since the analog-to-digital conversion device 10 may detect only ¼ of the range from ¼ of the range detected in 1 cycle, identification may be performed with only 2 bits. Finally, when identification is performed with 3 bits in 3 cycles, the analog-to-digital conversion device 10 may configure 7 bits.

FIG. 7B illustrates an example of detecting a ⅛ range. Referring to FIG. 7B, when the input voltage $V_{IN}$ is similar to the comparison voltage $2V_{ref}/4$ of the second comparator 132, the analog-to-digital conversion device 10 may skip the comparison results $C_P$ and $C_N$ of the second comparator 132. For example, when the least significant bit (LSB) in 1 Cycle is 32 bits, since the analog-to-digital conversion device 10 may detect only ⅛ of the range in the sampling period $-V_{REF}$ to $V_{REF}$ by skipping the comparison results $C_P$ and $C_N$ of some comparators, identification may be performed with only 3 bits. In addition, in the same way as above, when the least significant bit (LSB) in 2 cycles is 6 bits, since the analog-to-digital conversion device 10 may detect only ⅛ of the range from ⅛ of the range detected in 1 cycle, identification may be performed with only 3 bits. Finally, when identification is performed with 3 bits in 3 cycles, the analog-to-digital conversion device 10 may configure up to 9 bits. In this situation, overranging is applied to form an 8-bit configuration, and the number of bits may be changed depending on the discretion of the designer. For example, unlike the conventional analog-to-digital conversion device identifies 3 bits with 0 (000), 1 (001), 2 (010), 3 (011), 4 (100), 5 (101), 6 (110), and 7 (111), the analog-to-digital conversion device 10 may identify intermediate voltages 0.5 (000.1), 1.5 (001.1), 2.5 (010.1), 3.5 (011.1), 4.5 (100.1), 5.5 (101.5), and 6.5 (110.5).

As described above, the analog-to-digital conversion device 10 skips the comparison results $C_P$ and $C_N$ of some comparators, so it may be confirmed that there is no problem in the operation of the analog-to-digital conversion device 10, and may increase an operating speed of the conversion device.

Figure 8:
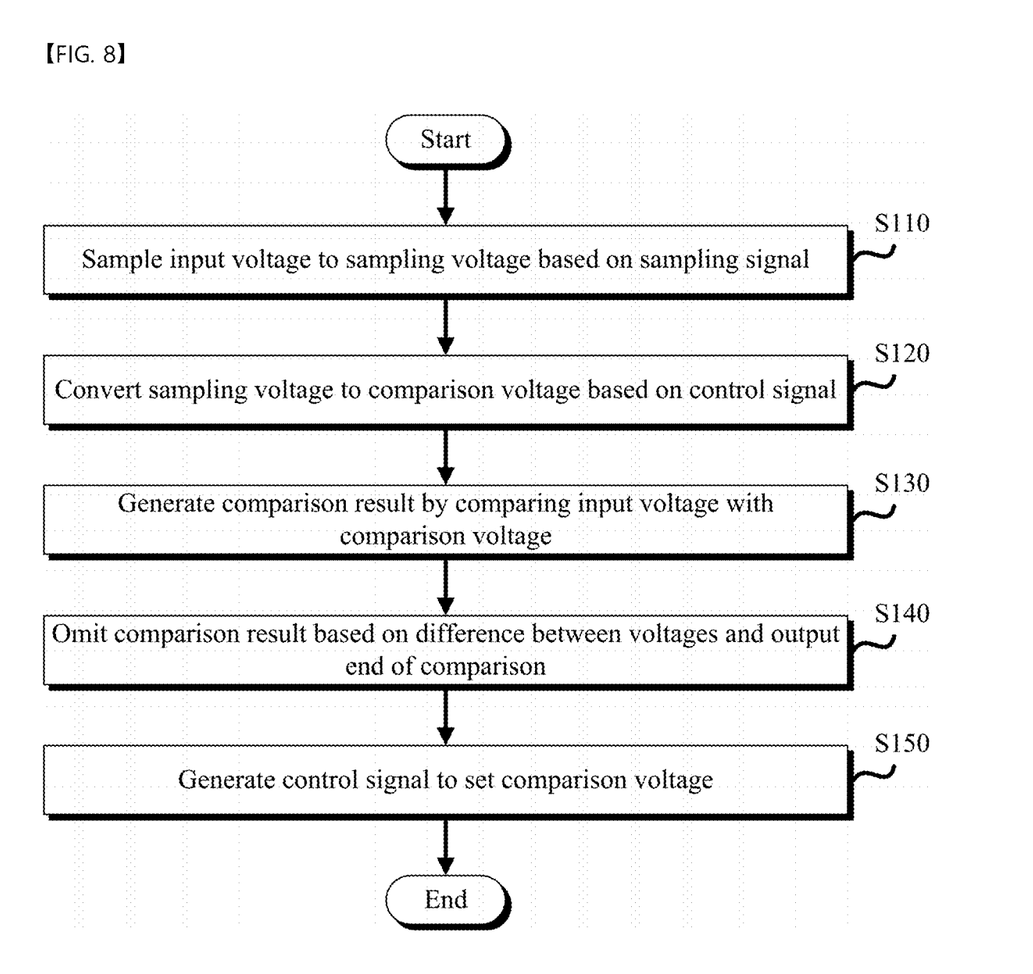
FIG. 8 is a flowchart illustrating an example of an operation of an analog-to-digital conversion device according to an embodiment of the present disclosure.

FIG. 8 is a flowchart illustrating an example of an operation of an analog-to-digital conversion device according to an embodiment of the present disclosure.

Referring to FIG. 8, in operation S110, the sampling/hold circuit 110 may sample the input voltage $V_{IN}$, which is an analog signal, to the sampling voltages $V_{S1}$, $V_{S2}$, $V_{S3}$, and $V_{S4}$ based on the sampling signal SAMP.

In operation S120, the converter circuit 120 may convert the sampling voltages $V_{S1}$, $V_{S2}$, $V_{S3}$, and $V_{S4}$ to the comparison voltage $V_{CDAC}$ based on the control signal CS.

In operation S130, the comparison unit 130 may generate comparison results $C_P$ and $C_N$ by comparing the input voltage $V_{IN}$ with the comparison voltage $V_{CDAC}$ through a plurality of comparators.

In operation S140, the calculation unit 200 may receive the comparison results $C_P$ and $C_N$, may skip any one comparison results $C_P$ and $C_N$ based on the difference between the comparison voltage $V_{CDAC}$ and the input voltage $V_{IN}$, and may output the end of comparison EOC through a logic gate.

In operation S150, the SAR logic unit 300 may generate the control signal CS to set the comparison voltage $V_{CDAC}$.

As described above, the analog-to-digital conversion device 10 may determine whether the operation of comparators are completed through the end of comparison EOC, and may operate quickly by skipping the comparison results $C_P$ and $C_N$ of comparators, in which decision time of some comparators is delayed.

According to an embodiment of the present disclosure, the comparison time may be decreased by reducing the decision time of a comparator. Accordingly, it is possible to increase the speed of the analog-to-digital conversion device and to reduce the error of the digital signal.

The above descriptions are specific embodiments for carrying out the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An analog-to-digital conversion device comprising:
   a signal generating unit configured to generate a plurality of comparison voltages based on an analog input voltage and to generate a plurality of comparison results with respect to the plurality of comparison voltages based on a sampling period;
   a calculation unit configured to skip a comparison result generated by a comparison voltage having a smallest difference between the analog input voltages among the plurality of comparison voltages from the plurality of comparison results, and to generate an end of comparison based on a remaining plurality of comparison results; and
   a SAR logic unit configured to generate a digital signal corresponding to the end of comparison and to store information for each bit of the digital signal,
   wherein the signal generating unit comprises:
   a comparison unit configured to invert a phase of at least one of the plurality of comparison voltages to generate a plurality of enlarged comparison voltages, and to output the plurality of comparison results based on the plurality of enlarged comparison voltages.

2. The analog-to-digital conversion device of claim 1, wherein the signal generating unit includes:
   a sampling/hold circuit configured to sample the analog input voltage to a sampling voltage based on the sampling period; and
   a converter circuit configured to convert the sampling voltage into the plurality of comparison voltages.

3. The analog-to-digital conversion device of claim 2, wherein the converter circuit performs a capacitor switching operation for adjusting the sampling period of the sampling voltage.

4. The analog-to-digital conversion device of claim 1, wherein the analog-to-digital conversion device is configured to detect a predetermined range in the sampling period.

5. The analog-to-digital conversion device of claim 1, wherein the end of comparison is output as a logic high level or a logic low level.

6. A method of operating an analog-to-digital conversion device, the method comprising:

generating a plurality of comparison voltages based on an analog input voltage, and generating a plurality of comparison results with respect to the plurality of comparison voltages based on a sampling period;

skipping a comparison result generated by a comparison voltage having a smallest difference between the analog input voltages among the plurality of comparison voltages from the plurality of comparison results, and generating an end of comparison based on a remaining plurality of comparison results; and generating a digital signal corresponding to the end of comparison and storing information for each bit of the digital signal, wherein the generating of the plurality of comparison results comprises inverting a phase of at least one of the plurality of comparison voltages to generate a plurality of enlarged comparison voltages, and outputting the plurality of comparison results based on the plurality of enlarged comparison voltages.

7. The method of claim 6, wherein the generating of the plurality of comparison results includes:

sampling the analog input voltage to a sampling voltage based on the sampling period; and converting the sampling voltage into the plurality of comparison voltages.

8. The method of claim 7, wherein the converting of the sampling voltage into the plurality of comparison voltages includes:

performing a capacitor switching operation for adjusting the sampling period of the sampling voltage.

9. The method of claim 6, wherein the method of operating the analog-to-digital conversion device includes detecting a predetermined range in the sampling period.

10. The method of claim 6, wherein the end of comparison is output as a logic high level or a logic low level.

* * * * *